US008058220B2

(12) United States Patent
Koshiyama et al.

(10) Patent No.: US 8,058,220 B2
(45) Date of Patent: Nov. 15, 2011

(54) CLEANING LIQUID FOR LITHOGRAPHY AND A CLEANING METHOD USING IT FOR PHOTOEXPOSURE DEVICES

(75) Inventors: Jun Koshiyama, Kawasaki (JP); Yoshihiro Sawada, Kawasaki (JP); Jiro Yokoya, Kawasaki (JP); Tomoyuki Hirano, Kawasaki (JP)

(73) Assignee: Tokyo Ohka Kogyo Co., Ltd., Kanagawa (JP)

( * ) Notice: Subject to any disclaimer, the term of this patent is extended or adjusted under 35 U.S.C. 154(b) by 0 days.

(21) Appl. No.: 12/801,529

(22) Filed: Jun. 14, 2010

(65) Prior Publication Data

US 2011/0061678 A1 Mar. 17, 2011

Related U.S. Application Data

(63) Continuation of application No. 12/588,723, filed on Oct. 26, 2009, now abandoned, which is a continuation of application No. 12/085,361, filed as application No. PCT/JP2006/323274 on Nov. 22, 2006.

(30) Foreign Application Priority Data

Nov. 22, 2005 (JP) ................................ 2005-337100

(51) Int. Cl.
*C11D 7/50* (2006.01)
(52) U.S. Cl. ........ 510/175; 510/176; 510/405; 510/499; 134/1.3
(58) Field of Classification Search .................. 510/175, 510/176, 405, 499; 134/1.3
See application file for complete search history.

(56) References Cited

U.S. PATENT DOCUMENTS

| | | | | |
|---|---|---|---|---|
| 4,414,128 A | * | 11/1983 | Goffinet | 510/405 |
| 4,790,951 A | * | 12/1988 | Frieser et al. | 510/365 |
| 4,891,222 A | * | 1/1990 | Eichhoefer | 424/770 |
| 5,112,516 A | * | 5/1992 | Koetzle | 510/417 |
| 5,281,354 A | * | 1/1994 | Faber | 510/397 |
| 5,308,531 A | * | 5/1994 | Urfer et al. | 510/434 |
| 5,399,282 A | * | 3/1995 | Hansen et al. | 510/400 |
| 5,840,676 A | * | 11/1998 | Drapier | 510/439 |
| 5,912,223 A | * | 6/1999 | Drapier | 510/417 |
| 5,948,743 A | * | 9/1999 | Fonsny et al. | 510/280 |
| 6,001,793 A | * | 12/1999 | Figdore et al. | 510/243 |
| 6,030,936 A | * | 2/2000 | Lu et al. | 510/424 |
| 6,184,195 B1 | * | 2/2001 | Cheung et al. | 510/432 |
| 6,465,411 B2 | * | 10/2002 | Manske et al. | 510/417 |
| 2005/0205108 A1 | | 9/2005 | Chang et al. | |
| 2006/0103818 A1 | | 5/2006 | Holmes et al. | |
| 2011/0061678 A1 | * | 3/2011 | Koshiyama et al. | 134/1 |

FOREIGN PATENT DOCUMENTS

| | | |
|---|---|---|
| JP | 07-096257 | 4/1995 |
| JP | 09-223679 | 8/1997 |
| JP | 2004/050266 | 6/2004 |
| JP | 2004-217814 | 8/2004 |
| JP | 2004-323840 | 11/2004 |
| JP | 2005-072404 | 3/2005 |
| JP | 2005-079222 | 3/2005 |
| WO | 2004/093130 | 10/2004 |

* cited by examiner

*Primary Examiner* — Gregory Webb
(74) *Attorney, Agent, or Firm* — Wenderoth, Lind & Ponack, L.L.P.

(57) ABSTRACT

Problem: To provide a cleaning liquid for lithography and a cleaning method using it for photoexposure devices. In a process of liquid immersion lithography, the cleaning liquid may efficiently clean the photoexposure device site (especially optical lens member) contaminated with the component released from photoresist and remove the contaminant, and in addition, the waste treatment for the cleaning liquid is easy, the efficiency in substitution with the cleaning liquid for the medium for liquid immersion lithography is high, and the cleaning liquid does not detract from the throughput in semiconductor production.
Means for Solution: A cleaning liquid for photolithography to be used for cleaning a photoexposure device in a process of liquid immersion lithography that comprises filling the space between the optical lens member of a photoexposure device and an object for photoexposure mounted on the wafer stage, with a medium for liquid immersion lithography, the cleaning liquid comprising (a) a surfactant, (b) a hydrocarbon solvent, and (c) water; and a cleaning method using it for photoexposure devices.

9 Claims, No Drawings

CLEANING LIQUID FOR LITHOGRAPHY AND A CLEANING METHOD USING IT FOR PHOTOEXPOSURE DEVICES

This is a continuation of Ser. No. 12/588,723, filed Oct. 26, 2009 now abandoned which is a continuation of Ser. No. 12/085,361, May 22, 2008 now abandoned, which the National Stage of International Application No. PCT/JP2006/323274, filed Nov. 22, 2006.

TECHNICAL FIELD

The present invention relates to a cleaning liquid for lithography and a cleaning method using it for photoexposure devices used for a process of liquid immersion lithography.

BACKGROUND ART

Photography is much used in fabrication of microstructures in various electronic devices such as semiconductor devices, liquid-crystal devices. Recently, the increase in the technical level of large-scale integration and microfabrication is great, and it is desired to further improve the technique of photoresist micropatterning in photolithography.

At present, for example, photolithography in the forefront of the region of high-technology has made it possible to form a photoresist micropattern having a line width of 90 nm or so, and further studies and developments are being made for micropatterning to a higher level to a line width of 65 nm or so.

For attaining micropatterning to such a higher level, in general, some methods of improving photoexposure devices or photoresist materials may be taken into consideration. Regarding the method of improving photoexposure devices, there may be mentioned a method of employing short-wave light sources of $F_2$ excimer laser, EUV (extreme-ultraviolet ray), electron ray, X ray, soft-X ray, and a method of employing lenses having an increased numerical aperture (NA).

However, the method of employing such short-wave light sources requires an additional expensive photoexposure unit. On the other hand, the method of employing such increased-NA lenses is problematic in that, since the resolution and the focal depth range are in a trade-off relationship, the increase in the resolution may lower the focal depth range.

Recently, liquid immersion lithography has been reported as a technique of photolithography capable of solving these problems (for example, see Non-Patent References 1 to 3). This method is for photoresist patterning through photoexposure of a photoresist film formed on a substrate, in which, in the photoexposure light pathway between the photoexposure device (lens) and the photoresist film, a liquid for liquid immersion lithography having a predetermined thickness is made to be on at least the photoresist film, and the photoresist film is exposed to light in that condition to thereby form a photoresist pattern. In the method of liquid immersion lithography, the photoexposure light pathway space, which is an inert gas such as air or nitrogen in conventional methods, is substituted with a liquid for liquid immersion lithography having a larger refractive index than that of the space (vapor) and having a smaller refractive index (n) than that of the photoresist film (for example, pure water, fluorine-containing inert liquid), and the advantage of the method is that, even though a photoexposure light source having the same wavelength level as that in conventional methods is used therein, the method may attain a high-level resolution like the case that uses a photoexposure light having a shorter wavelength or uses a high-NA lens and, in addition, the method does not result in the reduction in the focal depth range.

To that effect, the process of liquid immersion lithography is much noticed in the art, since it realizes photoresist patterning of high resolution to a good focal depth at low costs, using any lens actually mounted on the existing photoexposure devices therein.

However, in the process of liquid immersion lithography, the photoexposure is attained while a medium for liquid immersion lithography is made to be between the lens for photoexposure and the photoresist film, and therefore the method is problematic in that the photoexposure device may be damaged by the component released from the photoresist film into the medium for liquid immersion lithography (for example, the crystal material for the lens for photoexposure may be fogged, and as triggered by it, the transmittance of the lens may be lowered and the exposure may be uneven).

To solve the problem, employed are a method of improving the photoresist material to thereby prevent it from releasing the constitutive component, and a method of providing a layer of a protective film on the photoresist layer to thereby prevent the photoresist from releasing the constitutive component. However, the former method is limited in its development in point of the photoresist material and has another problem in that it could be hardly applicable to a wide variety of photoresists; and even the latter method could not completely prevent the photoresist from releasing the constitutive component.

Given that situation, another method of solving the above-mentioned problem has been proposed, still using the photoresist and the protective film now widely used in the art. The method comprises cleaning the optical lens member of the photoexposure device that is kept in contact with the medium for liquid immersion lithography, using a cleaning liquid (for example, see Patent Reference 1).

However, the cleaning liquid described in the patent publication comprises an organic, ketone-type or alcohol-type solvent; and even when said cleaning liquid is used, the effect of the method of removing the component released from photoresist, which is a high-risk factor of contamination, is insufficient, and the method could hardly keep the optical properties of photoexposure devices.

Other cleaning methods comprising cleaning the optical lens member of the photoexposure device that is kept in contact with the medium for liquid immersion lithography, using cleaning liquids, have been proposed (for example, see Patent Reference 2).

Non-Patent Reference 1: "Journal of Vacuum Science & Technology B", USA, 1999, Vol. 17, No. 6, pp. 3306-3309
Non-Patent Reference 2: "Journal of Vacuum Science & Technology B", USA, 2001, Vol. 19, No. 6, pp. 2353-2356
Non-Patent Reference 3: "Proceedings of SPIE", USA, 2002, Vol. 4691, pp. 459-465
Patent Reference 1: JP-2005-157259A
Patent Reference 2: US 2005/205108 A1

DISCLOSURE OF THE INVENTION

Problems that the Invention is to Solve

The present invention has been made in consideration of the above-mentioned situation, and its object is to provide a cleaning liquid having excellent cleaning capability and applicable to a process of liquid immersion lithography that uses photoresist and protective film now widely used in the art. The cleaning liquid is effective for reducing the damage of photoexposure devices caused by the components released from photoresist, its waste treatment is easy, and its substitution with a medium for liquid immersion lithography is easy, and it contributes toward production cost reduction not detracting from the throughput in semiconductor production.

Means for Solving the Problems

For solving the above-mentioned problems, the invention provides a cleaning liquid for photolithography to be used for cleaning a photoexposure device in a process of liquid immersion lithography that comprises filling the space between the optical lens member of a photoexposure device and an object for photoexposure mounted on the wafer stage, with a medium for liquid immersion lithography; the cleaning liquid comprising (a) a surfactant, (b) a hydrocarbon solvent, and (c) water.

The invention also provides a cleaning method for photoexposure devices in a process of liquid immersion lithography that comprises using a photoexposure device provided with at least an optical lens member, a wafer stage, a liquid-introducing flow line and a liquid-discharging flow line, introducing a medium for liquid immersion lithography into the space between the optical lens member and the object for photoexposure mounted on the wafer stage, through the liquid-introducing flow line, then thus filling the space with the medium for liquid immersion lithography and simultaneously discharging the medium for liquid immersion lithography through the liquid-discharging flow line to attain photoexposure; the cleaning method comprises introducing the above-mentioned cleaning liquid for photolithography through the same introducing flow line as that used for the introduction of the medium for liquid immersion lithography and making the cleaning liquid in contact with the photoexposure device for a predetermined period of time so as to clean the device, and discharging the used cleaning liquid through the same discharging flow line as that used for the discharging of the medium for liquid immersion lithography.

The invention also provides a cleaning method for photoexposure devices in a process of liquid immersion lithography that comprises filling the space between the optical lens member of a photoexposure device and an object for photoexposure mounted on the wafer stage, with a medium for liquid immersion lithography; the cleaning method comprises spraying the above-mentioned cleaning liquid for photolithography on the photoexposure device, or wiping the photoexposure device with a cloth sprayed with the cleaning liquid for photolithography, thereby to clean the photoexposure device.

Advantage of the Invention

According to the invention, there are provided a cleaning liquid for photolithography having excellent cleaning capability and a cleaning method for photoexposure devices using it. The cleaning liquid has high cleaning capability, not causing damage to the crystal material for lenses for photoexposure; and its waste treatment is easy; its substitution with a medium for liquid immersion lithography is easy; and it contributes toward production cost reduction not detracting from the throughput in semiconductor production.

BEST MODE FOR CARRYING OUT THE INVENTION

The cleaning liquid for photolithography of the invention is used for cleaning a photoexposure device in a process of liquid immersion lithography that comprises filling the space between the optical lens member of a photoexposure device and an object for photoexposure mounted on the wafer stage, with a medium for liquid immersion lithography, and the cleaning liquid comprises (a) a surfactant, (b) a hydrocarbon solvent, and (c) water.

As component (a), preferably used is a nonionic surfactant, and the nonionic surfactant is preferably at least one selected from polyoxyalkylene alkyl ether, polyoxyalkylene alkylphenyl ether, polyoxyalkylene alkyl fatty acid ester, polyoxyalkylene allylphenyl ether, polyoxyalkylene sorbitan fatty acid ester, sorbitan fatty acid ester, and polyoxyalkylene.

In the above, the polyoxyalkylene includes polyoxyethylene, polyoxypropylene and polyoxybutylene. The number of mols of the added polyoxyalkylene is preferably controlled to fall within a range of from 1 to 50 mols as the mean addition molar number thereof.

In the above, the alkyl group that constitutes the terminal etherified moiety of the polyoxyalkylene preferably has from 6 to 18 carbon atoms, concretely including a hexyl group, a heptyl group, an octyl group, a nonyl group, a decyl group, an undecyl group, a dodecyl group, a tridecyl group, a tetradecyl group, a pentadecyl group, a hexadecyl group, a heptadecyl group, an octadecyl group. The alkyl group may be branched or cyclic (and may be monocyclic or condensed cyclic), and may have an unsaturated bond, and a part of the hydrogen atoms constituting it may be substituted with an alcoholic hydroxyl group.

In the above, the fatty acid includes heptanoic acid, octanoic acid, nonanoic acid, decanoic acid, dodecanoic acid, tetradecanoic acid, pentadecanoic acid, hexadecanoic acid, heptadecanoic acid, octadecanoic acid. However, they should not be limited to these examples.

The above-mentioned nonionic surfactants such as polyoxyalkylene compounds and sorbitan fatty acid compounds are commercially available as "Newcol" series (by Nippon Nyukazai, Co., Ltd.), and these are favorably used herein.

As the nonionic surfactant, also usable are acetylene alcohol compounds, apart from the above-mentioned polyoxyalkylene compounds and sorbitan fatty acid compounds.

As the acetylene alcohol compounds, for example, preferably used are the compounds of the following general formula (I):

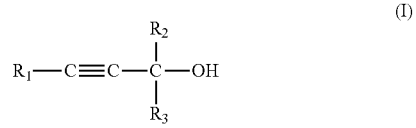

(wherein $R_1$ represents a hydrogen atom, or a group of the following formula (II):

$R_2$, $R_3$, $R_4$ and $R_5$ each independently represent a hydrogen atom, or an alkyl group having from 1 to 6 carbon atoms).

The acetylene alcohol compounds are commercially available, for example, as "Surfynol" and "Olfine" series (all by Air Product and Chemicals, Inc.), and these are favorably used herein. Of those, most preferred are "Surfynol 104", "Surfynol 82", and their mixtures. In addition, also usable are "Olfine B", "Olfine P", "Olfine Y".

Also usable are adducts prepared by adding alkylene oxide to the above-mentioned acetylene alcohol. The alkylene oxide to be added to the acetylene alcohol is preferably ethylene oxide, propylene oxide or their mixture.

As the acetylene alcohol/alkylene oxide adducts, preferred are the compounds of the following general formula (III):

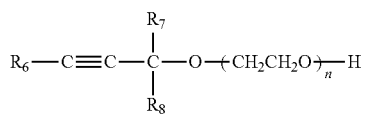

(III)

(wherein $R_6$ represents a hydrogen atom, or a group of the following formula (IV):

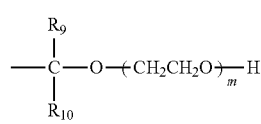

(IV)

$R_7$, $R_8$, $R_9$ and $R_{10}$ each independently represent a hydrogen atom, or an alkyl group having from 1 to 6 carbon atoms).

In the above, (n+m) is an integer of from 1 to 30; and depending on the number of the added ethylene oxides, the characteristics of the adducts, such as the solubility in water and the surface tension thereof, delicately vary.

The acetylene alcohol/alkylene oxide adducts are per-se known substances as surfactants. These are commercially available as "Surfynol" series (by Air Product and Chemicals, Inc), or "Acetylenol" series (by Kawaken Fine Chemicals Co., Ltd.), and are favorably used herein. Above all, in consideration of the variation in the characteristics such as the solubility in water and the surface tension of the compounds, depending on the number of the added ethylene oxides, preferred are "Surfynol 420", "Surfynol 440", "Surfynol 465", "Surfynol 485", "Acetylenol EL", "Acetylenol EH", and their mixtures.

Of the nonionic surfactants for the cleaning liquid for photolithography of the invention, preferred is a combination of at least one nonionic surfactant having an HLB value of at most 9, and at least one nonionic surfactant having an HLB value of more than 9. The HLB value is an index that indicates the hydrophilicity between water and oil. The HLB value as referred to herein is a mean HLB value of the individual nonionic surfactants. One having an HLB value of at most 9 and one having an HLB value of more than 9, as combined, may efficiently dissolve both component (b) and component (c).

The amount of component (a) is preferably from 0.01 to 5% by mass, more preferably from 0.1 to 2% by mass in the cleaning liquid for photolithography of the invention. When the amount of component (a) falls within the above range, the cleaning liquid may effectively evade a trouble to be caused by its separation, and may keep the cleaning capability.

In cases where at least two surfactants are used as above, their blend ratio may be suitably selected within a range not detracting from the cleaning capability.

As the surfactants, various cationic surfactants or anionic surfactants may be incorporated within a range not having any negative influence on the stability and the cleaning capability of the cleaning liquid for photolithography, apart from the nonionic surfactants.

As the hydrocarbon solvent of component (b), widely applicable are alkanes and alkenes. Above all, preferably used are linear chain or branched chain alkanes having from 8 to 12 carbon atoms, linear chain or branched chain alkenes having from 8 to 12 carbon atoms, and terpenes comprising at least 2 isoprene units.

The linear chain or branched chain alkanes and alkenes having from 8 to 12 carbon atoms are, in general, commercially available. Above all, from the viewpoint of the cleaning capability thereof, preferred are n-decane and 1-decene.

As the terpenes, preferred are monoterpenes and diterpenes. The monoterpenes include, for example, geraniol, nerol, linalool, citral, citronellol, p-menthane, diphenylmenthane, menthol, isomenthol, neomenthol, limonene, dipentene, terpinerol, carvone, ionone, thujone, camphor, bornane, borneol, norbornane, pinane, α-pinene, β-pinene, thujane, α-thujone, β-thujone, carane, camphor, α-terpinene, β-terpinene, γ-terpinene. The diterpenes include, for example, abiethane, abietic acid. Above all, the monoterpenes are preferred as easily available; and especially preferred is at least one selected from limonene, pinene and p-menthane as having high cleaning capability.

The amount of component (b) is preferably from 0.01 to 5% by mass, more preferably from 0.1 to 2% by mass in the cleaning liquid for photolithography of the invention. When the amount of component (b) is within the above range, the storage stability and the cleaning capability of the cleaning liquid may be more enhanced.

Component (c), water is incorporated as the balance of the liquid.

In the invention, in addition to the above-mentioned components (a) to (c), a water-soluble organic solvent may be incorporated as component (d). Component (d) includes at least one water-soluble organic solvent selected from alkanolamines, alkylamines, polyalkylenepolyamines, glycols, ethers, ketones, acetates, and carboxylates.

The alkanolamines include, for example, monoethanolamine, diethanolamine, triethanolamine, 2-(2-aminoethoxy) ethanol (=diglycolamine), N,N-dimethylethanolamine, N,N-diethylethanolamine, N,N-dibutylethanolamine, N-methylethanolamine, N-ethylethanolamine, N-butylethanolamine, N-methyldiethanolamine, monoisopropanolamine, diisopropanolamine, triisopropanolamine. However, they should not be limited to these examples.

The alkylamines include 2-ethyl-hexylamine, dioctylamine, tributylamine, tripropylamine, triallylamine, heptylamine, cyclohexylamine. However, they should not be limited to these examples.

The polyalkylenepolyamines include diethylenetriamine, triethylenetetramine, propylenediamine, N,N-diethylethylenediamine, N,N'-diethylethylenediamine, 1,4-butanediamine, N-ethyl-ethylenediamine, 1,2-propanediamine, 1,3-propanediamine, 1,6-hexanediamine. However, they should not be limited to these examples.

The glycols include ethylene glycol, diethylene glycol, propylene glycol, glycerin, 1,2-butylene glycol, 1,3-butylene glycol, 2,3-butylene glycol. However, they should not be limited to these examples.

The ethers include ethylene glycol monomethyl ether (=methyl cellosolve), ethylene glycol monoethyl ether (=ethyl cellosolve), ethylene glycol diethyl ether, ethylene glycol isopropyl ether, ethylene glycol mono-n-butyl ether, propylene glycol monomethyl ether, propylene glycol monoethyl ether, diethylene glycol monomethyl ether, diethylene glycol monoethyl ether, diethylene glycol mono-n-butyl ether (=butyldiglycol), diethylene glycol dimethyl ether, diethylene glycol diethyl ether, dipropylene glycol monomethyl ether, benzyl ethyl ether, dihexyl ether. However, they should not be limited to these examples.

The ketones include acetone, methyl ethyl ketone, diethyl ketone, methyl propyl ketone, methyl isobutyl ketone, methyl amyl ketone, diisopropyl ketone, cyclobutanone, cyclopentanone, cyclohexanone. However, they should not be limited to these examples.

The acetates include ethylene glycol monomethyl ether acetate (=methyl cellosolve acetate), ethylene glycol monoethyl ether acetate (ethyl cellosolve acetate), ethylene glycol mono-n-butyl ether acetate (=n-butyl cellosolve acetate), propylene glycol monomethyl ether acetate. However, they should not be limited to these examples.

The carboxylates include, for example, alkyl- or aliphatic-carboxylates, and monohydroxycarboxylates; concretely including methyl lactate, ethyl lactate, methyl acetate, ethyl acetate, propyl acetate, butyl acetate, amyl acetate, isoamyl acetate. However, they should not be limited to these examples.

In the invention, alkanolamines, glycols, ethers, ketones, acetates and carboxylates are preferred for component (d).

In cases where component (d) is added to the cleaning liquid for photolithography of the invention, its content is preferably from 0.1 to 20% by mass, more preferably from 1 to 8% by mass. When the content of component (d) falls within the defined range, the layer separation risk of the cleaning liquid for lithography may be reduced, and a stable and uniform solution may be provided, and in addition, the cleaning capability may be much more enhanced.

The cleaning method for photoexposure devices with the cleaning liquid for photolithography of the invention is, for example, as follows:

First, an ordinary photoresist composition is applied onto a substrate such as silicon wafer as an object for photoexposure, using a spinner, and then prebaked (PAB treatment) to form a photoresist film. As the case may be, after one layer of an organic or inorganic antireflection film (underlayer antireflection film) is formed on the substrate, the photoresist film may be formed thereon.

Not specifically defined, the photoresist composition may be any photoresist developable with an aqueous alkali solution, including negative and positive photoresists. The photoresist includes (i) a positive photoresist that contains a naphthoquinonediazide compound and a novolak resin, (ii) a positive photoresist that contains a compound capable of generating an acid through exposure to light, a compound capable of decomposing with an acid to have an increased solubility in aqueous alkali solution, and an alkali-soluble resin, (iii) a positive photoresist that contains a compound capable of generating an acid through exposure to light, and an alkali-soluble resin having a group capable of decomposing with an acid to have an increased solubility in aqueous alkali solution, and (iv) a negative photoresist that contains a compound capable of generating an acid or a radical by light, a crosslinking agent and an alkali-soluble resin. However, the invention should not be limited to these. As the case may be, a protective film may be formed on the surface of the photoresist film.

Next, the substrate with the photoresist film formed thereon is mounted on a wafer stage of a photoexposure device. Preferably, the photoexposure device comprises, in addition to the wafer stage, an optical lens member disposed above the wafer stage to face it, as spaced from it by a predetermined distance therebetween, and additionally comprises a liquid introducing flow line and a liquid discharging flow line.

Next, a medium for liquid immersion lithography is introduced into the space between the photoresist film-having substrate and the optical lens member in one direction to the wafer stage through the liquid introducing flow line, and at the same time with it, the medium for liquid immersion lithography is discharged (drawn) out in the other direction from the wafer stage through the liquid discharging flow line, and in that condition while the space is filled with the medium for liquid immersion lithography, the photoresist film is selectively exposed to light through a mask pattern.

In a process of local liquid immersion lithography, while the wafer stage is scanned at high speed relative to the photoexposure lens and while a medium for liquid immersion lithography is continuously dropwise applied onto the photoresist film through a liquid introducing nozzle (liquid introducing flow line), the photoresist film is selectively exposed to light. The photoresist film on the substrate, onto which a medium for liquid immersion lithography is continuously dropwise applied, is selectively exposed to light through a mask pattern. The excessive medium for liquid immersion lithography is discharged out through the liquid discharging nozzle (liquid discharging flow line). Also employable is a method of exposing the photoresist layer-having substrate to light, while the substrate is kept immersed in a medium for liquid immersion lithography.

Under any condition as above, at least the space between the lens and the photoresist layer-having substrate is filled with a medium for liquid immersion lithography. In that condition, the photoresist film on the substrate is selectively exposed to light through a mask pattern. Accordingly, in this stage, the photoexposure light reaches the photoresist film after having passed through the medium for liquid immersion lithography.

In this stage, the photoresist-constituting component may be released from the photoresist film and may dissolve in the medium for liquid immersion lithography, and it may adhere to the photoexposure device as a contaminant thereto.

The photoexposure light is not specifically defined, for which usable are any radiations such as ArF excimer laser, KrF excimer laser, $F_2$ excimer laser, EB, EUV, VUV (vacuum ultraviolet ray).

Not specifically defined, the medium for liquid immersion lithography may be any liquid having a refractive index larger than that of air and smaller than that of the photoresist film used. The medium for liquid immersion lithography of the type includes water (pure water, deionized water; refractive index 1.44), liquids containing various additives added thereto for increasing the refractive index, fluorine-containing inert liquids, silicon-based inert liquids, hydrocarbon liquids. In addition, also usable herein is a medium for liquid immersion lithography having high-refractivity characteristics, which may be developed in near future. Specific examples of the fluorine-containing inert liquids are liquids comprising, as the principal ingredient thereof, a fluorine-containing compound such as $C_3HCl_2F_5$, $C_4F_9OCH_3$, $C_4F_9OC_2H_5$, $C_5H_3F_7$. Of those, preferred is water (pure water, deionized water) from the viewpoint of the cost, the safety, the environmental problem and the wide-range applicability thereof. However, when a photoexposure light having a wavelength of 157 nm (e.g., $F_2$ excimer laser) is used, then preferred for it is a fluorine-containing solvent from the viewpoint that the absorption of the photoexposure light by the solvent is small.

After the step of photoexposure in liquid immersion as above, the substrate is taken out of the medium for liquid immersion lithography, and then the liquid is removed from on the substrate.

Next, the cleaning liquid for photolithography of the invention is brought into contact with the photoexposure device, especially the site of the optical lens member that was contacted with the medium for liquid immersion lithography therein, whereby the component released from the photoresist film is removed and cleaned off. Not specifically defined, the contact time may well be a period of time within which the photoresist-released component could be removed and cleaned off; and in general, it may be from 30 seconds to 10 minutes or so. Accordingly, even though a component released from a photoresist film has adhered to the photoexposure device, especially to the optical lens member, it may be immediately removed, and therefore, the invention secures high-definition photoexposure treatment all the time in a cleaned condition, and may reduce the risk of defect occurrence. Through the photoexposure, a photoresist pattern of high reliability can be formed.

The cleaning liquid for photolithography of the invention may be used through the same flow lines as those used in introduction and discharging of the medium for liquid immersion lithography. Accordingly, the cleaning liquid does not require any additional flow lines for it, therefore contributing to production cost reduction.

For bringing the cleaning liquid into contact with photoexposure devices, any other method than the above may also be employed. For example, the cleaning liquid of the invention may be directly sprayed on photoexposure devices, or photoexposure devices may be wiped with a cloth sprayed with the cleaning liquid, whereby the devices may be cleaned. However, the cleaning method of the invention should not e limited to those exemplified in the above.

Next, the exposed photoresist film is subjected to PEB (post exposure baking), and then developed with an alkali developer comprising an aqueous alkali solution. The alkali developer may be any ordinary one. After the development, the substrate may be post-baked. Subsequently, this is rinsed with pure water or the like. The rinsing with water may be effected, for example, as follows: While the substrate is rotated, water is dropped or sprayed onto the surface of the substrate so that the developer and the protective film component and the photoresist composition having been dissolved by the developer are washed away. Then, this is dried, and the photoresist film is patterned in accordance with the profile of the mask pattern, thereby giving a photoresist pattern.

In that manner, a photoresist pattern is formed. Thus formed, the photoresist pattern has a microstructure of good resolution, and in particular it may be a line-and-space pattern having a small pitch.

EXAMPLES

The invention is described in more detail with reference to the following Examples, by which, however, the invention should not be restricted at all.

Examples 1 to 9

Comparative Examples 1 to 5

A test tool of the following constitution was prepared for reproducing the contamination of a photoexposure lens in a condition of liquid immersion lithography.

First, a photoacid generator in a photoresist component, "TPS-PFBS (tetraphenylsulfonium perfluorobutanesulfonate)", which is expected to be a cause of contamination of photoexposure lens, was dissolved in pure water, and the aqueous 500-ppm solution was used as a test chemical liquid.

Next, a transparent cell was disposed in the course of a duct structure, in which a liquid could flow at a constant flow rate, and the above test chemical liquid was introduced into the duct from its one end, while discharged out through the other side. A photoexposure lens for liquid immersion lithography was disposed on either one side of the transparent cell through which the duct was not disposed.

In the direction to the side of the cell on which the photoexposure lens for liquid immersion lithography was disposed, a pulse-wave ArF excimer laser was applied, and in that condition, the test liquid chemical was led to flow through the transparent cell with the photoexposure lens for liquid immersion lithography disposed therein.

The ArF excimer laser was pulsewise radiated as above, and this is because both the contamination caused by the photoacid generator as dissociated and ionized through irradiation with light and that caused by the photoacid generator not dissociated through no irradiation with light could be reflected as the contamination of the test tool to be the contamination in actual photoexposure.

Using the test tool of the constitution as above, the above-mentioned test chemical liquid was led to flow through it at a flow rate of 0.1 L/min, and with that, an ArF excimer laser was applied to it at an exposure level of 0.18 mJ at a pulse of $1.76 \times 10^5$, whereby the surface of the photoexposure lens was made to adsorb a contaminant.

The photoexposure lens for liquid immersion lithography with the contaminant adhering thereto was dipped in a cleaning liquid having the composition shown in Table 1 for 10 minutes, then subsequently rinsed with water for 30 minutes, and dried by nitrogen blowing; and then this was visually checked, and the cleaning effect for it was evaluated according to the following evaluation standards. The results are shown in Table 1.

[Evaluation Standards for Cleaning Effect]
A: The contaminant adhering to the photoexposure lens for liquid immersion lithography was well cleaned off and removed.
B: Not cleaned off and removed, the contaminant adhering to the photoexposure lens for liquid immersion lithography remained as a residue.

TABLE 1

|  | Constitutive Components (% by mss) | | | | Cleaning Effect |
|---|---|---|---|---|---|
|  | (a) | (b) | (c) | (d) |  |
| Example 1 | S1 + S2 (0.2 + 0.2) | 1-decene (0.10) | water (balance) | — | A |
| Example 2 | S1 + S2 (0.2 + 0.2) | limonene (0.10) | water (balance) | — | A |
| Example 3 | S1 + S2 (0.375 + 0.375) | 1-decene (0.25) | water (balance) | BDG (4.0) | A |
| Example 4 | S1 + S2 (0.375 + 0.375) | pinene (0.25) | water (balance) | EDG (4.0) | A |
| Example 5 | S1 + S2 (0.375 + 0.375) | limonene (0.25) | water (balance) | BDG (4.0) | A |
| Example 6 | S1 + S2 (0.3 + 0.3) | pinene (0.4) | water (balance) | EDG (4.0) | A |
| Example 7 | S1 + S2 (0.3 + 0.3) | limonene (0.4) | water (balance) | BDG (4.0) | A |
| Example 8 | S3 + S4 (0.375 + 0.375) | limonene (0.25) | water (balance) | BDG (4.0) | A |

TABLE 1-continued

| | Constitutive Components (% by mss) | | | | Cleaning Effect |
|---|---|---|---|---|---|
| | (a) | (b) | (c) | (d) | |
| Example 9 | S5 + S6 (0.375 + 0.375) | limonene (0.25) | water (balance) | BDG (4.0) | A |
| Comparative Example 1 | S1 (0.75) | — | water (balance) | — | B |
| Comparative Example 2 | S1 + S2 (0.375 + 0.375) | — | water (balance) | — | B |
| Comparative Example 3 | S1 (0.75) | — | water (balance) | BDG (5.0) | B |
| Comparative Example 4 | — | — | water (balance) | BDG (50) | B |
| Comparative Example 5 | — | — | — | IPA (100) | B |

In Table 1, the abbreviations mean the following compounds.
S1: polyoxyethylene-2-ethylhexyl ether (Newcol 1020", by Nippon Nyukazai; HLB=17.4),
S2: sorbitan trioleate ("Newcol 3-80", by Nippon Nyukazai; HLB=3.4),
S3: polyoxyethylene stearyl ether ("Newcol 1820", by Nippon Nyukazai; HLB=15.3),
S4: polyoxyethylene lauryl ether ("Newcol 2502-A", by Nippon Nyukazai; HLB=6.3),
S5: acetylene alcohol/ethylene oxide adduct ("Surfynol 420", by Air Products; HLB=4.0),
S6: acetylene alcohol/ethylene oxide adduct ("Surfynol 485", by Air Products; HLB=17.0),
EDG: diethylene glycol monoethyl ether,
BDG: diethylene glycol monobutyl ether,
IPA: isopropyl alcohol.

INDUSTRIAL APPLICABILITY

The cleaning liquid and the cleaning method of the invention have excellent leaning capability, and in a process of liquid immersion lithography in which a photoresist and a protective film now widely used in the art are used, they can prevent the damage to be caused by the component released from the photoresist to photoexposure devices. In addition, the waste treatment is easy, the efficiency in substitution with the cleaning liquid for the medium for liquid immersion lithography is high, and the production cost is reduced not detracting from the throughput in semiconductor production.

The invention claimed is:

1. A cleaning liquid for photolithography to be used for cleaning a photoexposure device in a process of liquid immersion lithography that comprises filling the space between the optical lens member of a photoexposure device and an object for photoexposure mounted on the wafer stage, with a medium for liquid immersion lithography; the cleaning liquid comprising (a) a surfactant, (b) a hydrocarbon solvent, and (c) water,
wherein component (a) contains at least two surfactants of at least one selected from surfactants having a mean HLB value of at most 9 and at least one selected from surfactants having a mean HLB value of more than 9, and
wherein component (b) is at least one selected from linear or branched alkanes having from 8 to 12 carbon atoms, and linear or branched alkenes having from 8 to 12 carbon atoms.

2. The cleaning liquid for photolithography as claimed in claim 1, wherein component (a) is a nonionic surfactant.

3. The cleaning liquid for photolithography as claimed in claim 1, wherein component (a) is at least one selected from polyoxyalkylene alkyl ethers, polyoxyalkylene alkylphenyl ethers, polyoxyalkylene alkyl fatty acid esters, polyoxyalkylene allylphenyl ethers, polyoxyalkylene sorbitan fatty acid esters, sorbitan fatty acid esters, polyoxyalkylenes, and acetylene alcohol compounds.

4. The cleaning liquid for photolithography as claimed in claim 1, which contains component (a) in an amount of from 0.01 to 5% by mass, component (b) in an amount of from 0.01 to 5% by mass, and component (c) as the balance.

5. The cleaning liquid for photolithography as claimed in claim 1, which further contains (d) a water-soluble organic solvent.

6. The cleaning liquid for photolithography as claimed in claim 5, wherein component (d) is at least one selected from alkanolamines, alkylamines, polyalkylenepolyamines, glycols, ethers, ketones, acetates, and carboxylates.

7. The cleaning liquid for photolithography as claimed in claim 5, which contains component (d) in an amount of from 0.1 to 20% by mass.

8. A cleaning method for photoexposure devices in a process of liquid immersion lithography that comprises using a photoexposure device provided with at least an optical lens member, a wafer stage, a liquid-introducing flow line and a liquid-discharging flow line, introducing a medium for liquid immersion lithography into the space between the optical lens member and the object for photoexposure mounted on the wafer stage, through the liquid-introducing flow line, then thus filling the space with the medium for liquid immersion lithography and simultaneously discharging the medium for liquid immersion lithography through the liquid-discharging flow line to attain photoexposure; the cleaning method comprises introducing the cleaning liquid for photolithography of claim 1 through the same introducing flow line as that used for the introduction of the medium for liquid immersion lithography and making the cleaning liquid in contact with the photoexposure device for a predetermined period of time so as to clean the device, and discharging the used cleaning liquid through the same discharging flow line as that used for the discharging of the medium for liquid immersion lithography.

9. A cleaning method for photoexposure devices in a process of liquid immersion lithography that comprises filling the space between the optical lens member of a photoexposure device and an object for photoexposure mounted on the wafer stage, with a medium for liquid immersion lithography; the cleaning method comprises spraying the cleaning liquid for photolithography of claim 1 on the photoexposure device, or wiping the photoexposure device with a cloth sprayed with the cleaning liquid for photolithography, thereby to clean the photoexposure device.

* * * * *